(12) United States Patent
Douskey et al.

(10) Patent No.: US 8,516,318 B2
(45) Date of Patent: Aug. 20, 2013

(54) DYNAMIC SCAN

(75) Inventors: Steven M. Douskey, Rochester, MN (US); Ryan A. Fitch, Auburn Hills, MI (US); Michael J. Hamilton, Rochester, MN (US); Amanda R. Kaufer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 12/968,627

(22) Filed: Dec. 15, 2010

(65) Prior Publication Data

US 2012/0159273 A1    Jun. 21, 2012

(51) Int. Cl.
*G06F 11/00*    (2006.01)

(52) U.S. Cl.
USPC ........................... 714/727; 714/731

(58) Field of Classification Search
USPC ................... 714/726, 727, 729, 731
See application file for complete search history.

(56) References Cited

U.S. PATENT DOCUMENTS

| | | | |
|---|---|---|---|
| 6,539,497 B2* | 3/2003 | Swoboda et al. | 714/30 |
| 6,636,997 B1* | 10/2003 | Wong et al. | 714/728 |
| 6,704,895 B1* | 3/2004 | Swoboda et al. | 714/726 |
| 6,920,416 B1* | 7/2005 | Swoboda et al. | 703/13 |
| 7,962,885 B2* | 6/2011 | Chakraborty et al. | 714/726 |
| 2006/0059387 A1* | 3/2006 | Swoboda et al. | 714/30 |
| 2007/0106923 A1* | 5/2007 | Aitken et al. | 714/718 |
| 2009/0193304 A1* | 7/2009 | Chakraborty et al. | 714/726 |
| 2009/0193306 A1* | 7/2009 | Chakraborty et al. | 714/729 |
| 2010/0229058 A1* | 9/2010 | Goyal et al. | 714/731 |
| 2011/0231720 A1* | 9/2011 | Zuo et al. | 714/729 |

* cited by examiner

*Primary Examiner* — Marc Duncan
(74) *Attorney, Agent, or Firm* — Bockhop & Associates LLC (57) ABSTRACT

In a test data access system, a shift register is coupled the test data in pin. A first multiplexer is in data communication with the TDI pin and is configured to receive data from the TDI pin and to transmit data to each of the instruments. The first multiplexer is also configured to receive data from a data recirculation bit and to transmit data from the TDI pin to a plurality of instruments when the recirculation bit has a first value and to transmit data to the plurality of instruments from a recirculation line when the recirculation bit has a second value, different from the first value. A second multiplexer is configured to receive data from each of the plurality of instruments and is configured to transmit data from a selected one of the plurality of instruments, selected based on a value of data in the shift register. A first AND gate is configured to generate a gates clock to the shift register. A second AND gate is responsive to the first AND gate, configured to lock the shift register. A third AND gate, responsive to the first AND gate, is configured to control clocking to the plurality of instruments.

19 Claims, 6 Drawing Sheets

DYNAMIC SCAN

BACKGROUND OF THE INVENTION

1. Field of the Invention

The present invention relates to electronic circuits and, more specifically, to a system for scanning test data into and out of electronic circuits.

2. Description of the Related Art

As the demands placed on integrated circuit devices an circuit boards on which they reside continue to increase, the need to measure the specific performance features of such devices has become particularly important in the design cycle. JTAG (Joint Test Action Group) is an industry standard for a method to test electronic circuit boards and integrated circuits. JTAG provides a single point of access to a circuit, allowing test data to be written to and to be read from predetermined test locations in the circuit.

While JTAG is commonly used in finding circuit faults during manufacturing, it is also used by developers and service personnel in debugging computer circuits. On most systems, JTAG-based debugging is available from the very first instruction after a CPU reset. As such, JTAG can even support software development.

In many ICs today, all the pins that connect to electronic logic are linked together in a set called the Boundary Scan chain. Boundary scan description language (BSDL) is used to generate commands for testing under JTAG. Boundary-scan technology is commonly used with JTAG. By using JTAG to manipulate the scan chain's external interface (inputs and outputs to other chips) it is possible to test for faults. By using JTAG to manipulate its internal interface to on-chip registers, the logic circuits in a chip can be tested. When combined with built-in self-test (BIST), the JTAG scan chain enables a low overhead, embedded solution to testing an IC for certain static faults (shorts, opens, and logic errors).

Internal JTAG (IJTAG) is a new standard that allows simpler access to a circuit than the access allowed by JTAG. Specifically, IJTAG allows access to a plurality of circuit elements (referred to as "instruments") within a circuit by connecting the instruments through a daisy chain configuration beginning with a test access port (TAP). Under such a configuration, each instrument includes a test data in ("TDI") and a test data out ("TDO"). Each TDI receives data from a TDO of another instrument (except for the TDI and TDO connected to the TAP).

Test data is scanned into an initial TDI from the TAP and then is scanned from instrument to instrument until it arrives at the desired instrument. Disadvantageously, however, this scanning can be time consuming for remote instruments.

Therefore, there is a need for a system for better controlling the scanning of test data into instruments in a circuit.

SUMMARY OF THE INVENTION

The disadvantages of the prior art are overcome by the present invention which, in one aspect, is a test data access system operable on an electronic circuit that includes a plurality of instruments. A test access port includes a test data in (TDI) pin, a test data out (TDO) pin, a decode pin, a reset pin and a clock pin. A shift register is coupled to the TDI pin. A first multiplexer is in data communication with the TDI pin and is configured to receive data from the TDI pin and to transmit data to each of the instruments. The first multiplexer is also configured to receive data from a data recirculation bit and to transmit data from the TDI pin to a plurality of instruments when the recirculation bit has a first value and to transmit data to the plurality of instruments from a recirculation line when the recirculation bit has a second value, different from the first value. A second multiplexer is configured to receive data from each of the plurality of instruments and is configured to transmit data from a selected one of the plurality of instruments, selected based on a value of data in the shift register. A first AND gate is configured to generate a gates clock to the shift register. A second AND gate is responsive to the first AND gate, configured to lock the shift register. A third AND gate, responsive to the first AND gate, is configured to control clocking to the plurality of instruments.

In another aspect, the invention is a test data register in an electronic circuit. A plurality of select instrument bits each includes a test data in line and a test data out line. The plurality of select instrument bits are each arranged in a sequence so that the test data out line of each select instrument bit is in data communication with a the test data in line of an adjacent select instrument bit. Each select instrument bit is configured so as to select a different instrument in an electronic circuit. A recirculation line couples the test data in line of a first select instrument bit of the plurality of select instrument bits to the test data out line of a last select instrument bit of the plurality of select instrument bits so as to enable reading of data stored in the plurality of select instrument bits to be read from the test data out line of the last select instrument bit while scanning the data back into the test data register through the test data in line of the first select instrument bit.

In another aspect, the invention is a hierarchical test data topology in an electronic circuit that includes a plurality of lockable shift tree blocks. Each shift tree block includes a scan data in line and a scan data out line. Each of the plurality of shift tree blocks is in data communication with a successive shift tree block so as to be arranged in a tree structure. A plurality of instruments is each in data communication with a different one of the plurality of lockable shift tree blocks. A selecting mechanism reads a shift data header. The shift data header includes a plurality of pairs of select and lock bits. Each pair is targeted for a selected one of the plurality of lockable shift tree blocks. The selecting mechanism also writes a different one of the pairs of select and lock bits to each of the plurality of lockable shift tree blocks. Each of the lockable shift tree blocks is configured be part of a dynamic scan path when its corresponding select and lock bit pair are set at a first state and wherein each of the lockable shift tree blocks is configured not be part of the dynamic scan path when its corresponding select and lock bit pair are set at a second state that is different from the first state.

In yet another aspect, the invention is a method of accessing a test data system, in which a first portion of a test data stream is written to a shift register. A second portion of the test data stream is written to a selected instrument when a value of a recirculation bit is set to a first state. Data from a recirculation line is written into the selected instrument when the value of the test data stream is at a first data stream state and a recirculation bit in the shift register is set to a second state, different from the first state. The writing data from a recirculation line into the selected instrument is stopped when the value of the test data stream is at a second data stream state, different from the first data stream state and when the value of the recirculation bit in the shift register is set to a second state, different from the first state These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 1:
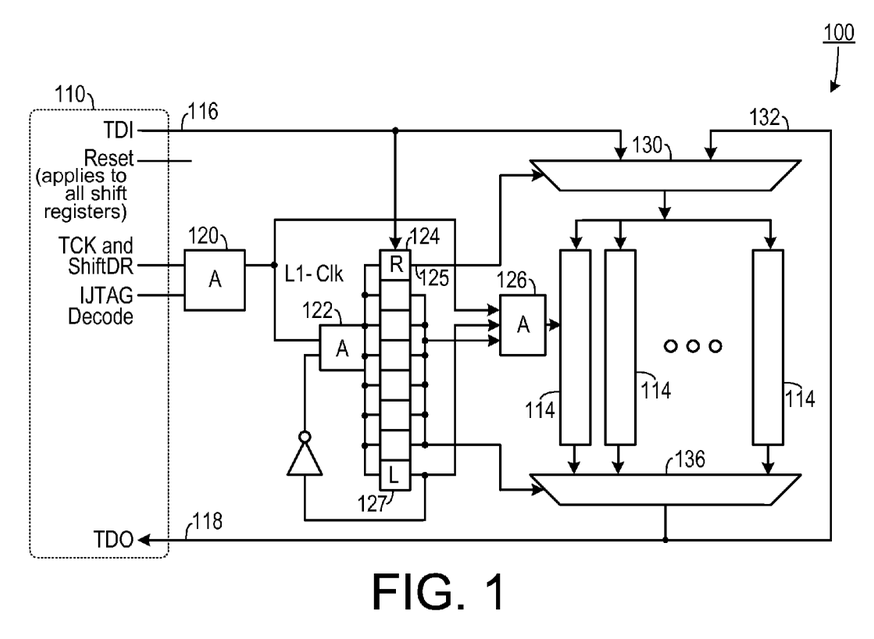
FIG. 1 is a schematic diagram of a first embodiment of a test data access system.

As shown in FIG. 1, one embodiment includes a test data access system 100, which could operate as a reconfiguration to an IJTAG system or which could be part of a separate test data system. Typically, the test data system 100 would operable on an electronic circuit, which could be embodied as a circuit board or a separate integrated circuit. The electronic circuit would include a plurality of instruments 114, which are circuit elements to which test data may be individually written and from which test data may be individually read.

Control of the writing and reading of test data is through a test access port 110. The test access port 110 (TAP) includes a test data in (TDI) pin 116, a test data out (TDO) pin 118, an IJTAG decode pin, a reset pin and a clock pin. Test data are written to the instruments 114 through the TDI pin and from the instruments 114 through the TDO pin 116. A shift register 124 is coupled the TDI pin and includes both a recirculation bit 125 and a lock bit 127. A first multiplexer 130 receives data from the TDI pin 116 and from a recirculation line 132. Depending on the value of the recirculation bit 125, the first multiplexer 130 transmits data to each of the instruments 114 from either the TDI pin 116 or the recirculation line 132. A second multiplexer 136 is configured to receive data from each of the instruments 114 and transmits data to the TDO pin 118 that is selected from one of the instruments 114 based on the value of the data in the shift register 124. A first AND gate 120 generate a gates clock signal that clocks data shifting into the shift register 124 based on the clock pin and the IJTAG state decode pin (or JTAG state pin, depending on the embodiment). A second AND gate 122 is responsive to the first AND gate 120 and locks the shift register 124 based on the value of the lock bit 127. A third AND gate 126 is responsive to the first AND gate 120 and the lock bit 127 and controls clocking to the plurality of instruments 114.

In one mode of operation, the system 100 shifts a first portion of a data stream from the TDI pin 116 into the shift register 124 and then, after the lock bit 127 is set, writes the data through the first multiplexer 130 if the recirculation bit 125 is not set. If the recirculation bit 125 is set, then the data from a selected one of the plurality of instruments 114 is recirculated through the recirculation line 132 via the second multiplexer 136.

This embodiment is similar to IJTAG in that a single instruction register (IR) decode is used for the entire IJTAG section. The IJTAG partition has two basic structures, a section of test data registers (TDR's) and an address section. In this embodiment, the data register scan chain is configured on-the-fly depending on what address is scanned into the shift register 124 first. A typical operation might include the following actions:

Load IR to enable function
Pass thru CaptureDR resets address (ADDR);
shift new L, then address, then R, then data;
   once L=1 the ADDR/R is locked and the shift path changes to the TDR selected by the address;
      if R=0 the recirculate path is disabled and data comes from TDI;
      if R=1 the recirculate path is enabled and data comes from the end of the selected TDR. Shift clocks must then exactly match the selected TDR length;
   once complete a pass thru UpdateDR resets the ADDR;
if another TDR is required the IR enable is still valid, so another loop thru the Data shift side of the TAP will load a new ADDR for another data shift.

Figure 2:
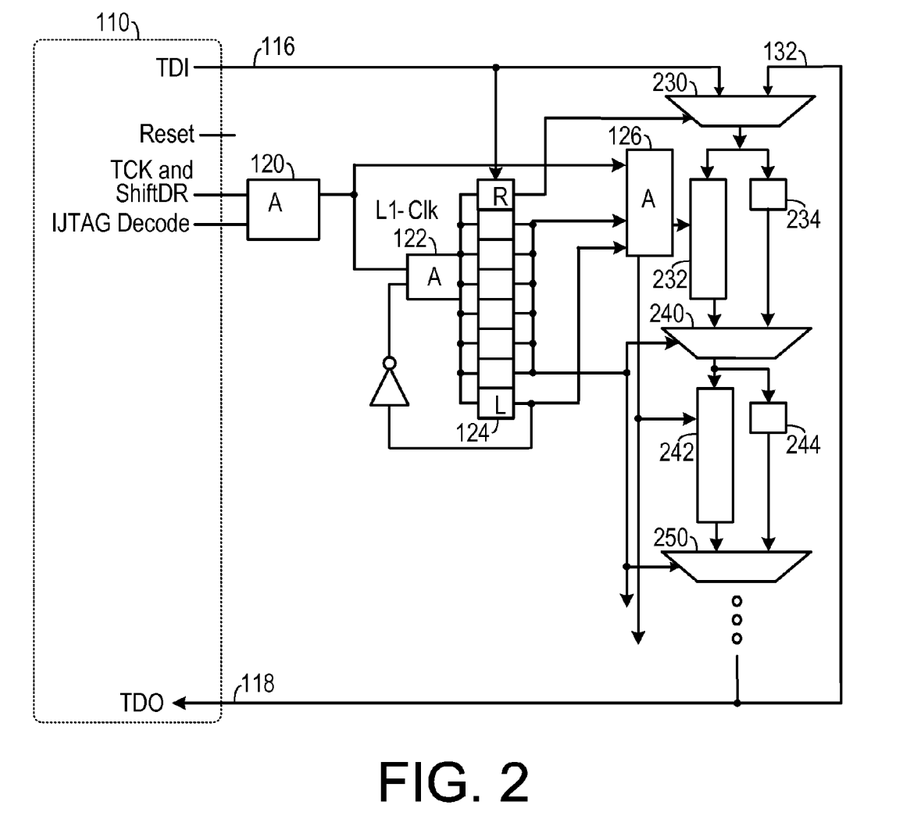
FIG. 2 is a schematic diagram of a second embodiment of a test data access system.

In another embodiment, as shown in FIG. 2, a first multiplexer 230 selectively receives data from either a TDI line 116 or a recirculation line 132, which is coupled to a TDO line 118. Data from the first multiplexer 230 can be read into a first instrument 232 or go to a first pass through driver 234. A second multiplexer 240 selects data from either the instrument 232 or the pass through driver 234 and the data can then go to a second instrument or a second pass through driver 244. A third multiplexer 250 then selects between the second instrument and the second pass through driver 244. In this manner, the system can select specific instruments to write to and to read from. This system has an advantage of employing relatively simple multiplexers.

Figure 3:
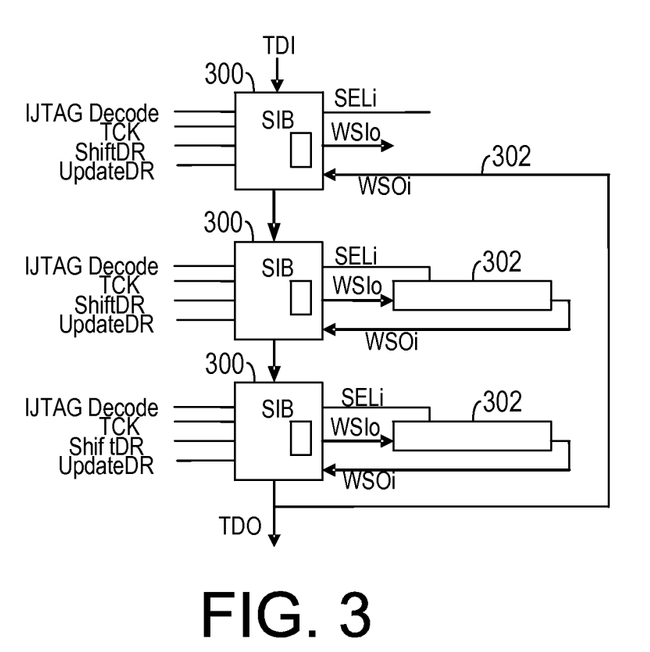
FIG. 3 is a schematic diagram of a chain of select instrument bit cells.

As shown in FIG. 3, existing IJTAG-type select instrument bit (SIB) cells 300 can be arranged to support a recirculation function. In such an arrangement, each SIB cell 300 includes a test data in (TDI) and a test data out (TDO), with the TDO's of one SIB cell 300 coupled to the TDI's of a succeeding SIB cell 300. The wrapper serial input-output (WSIo), which passes the serial scan-path from the parent-instrument to the child-instrument) and wrapper serial output-input (WSOi), which is the return of the serial scan-path from the Child-Instrument back to the Parent-Instrument) lines are coupled to an instrument. The TDO of a latter SIB cell 300 can be feed to the WSO of a previous cell via a recirculation line 304.

Figure 4:
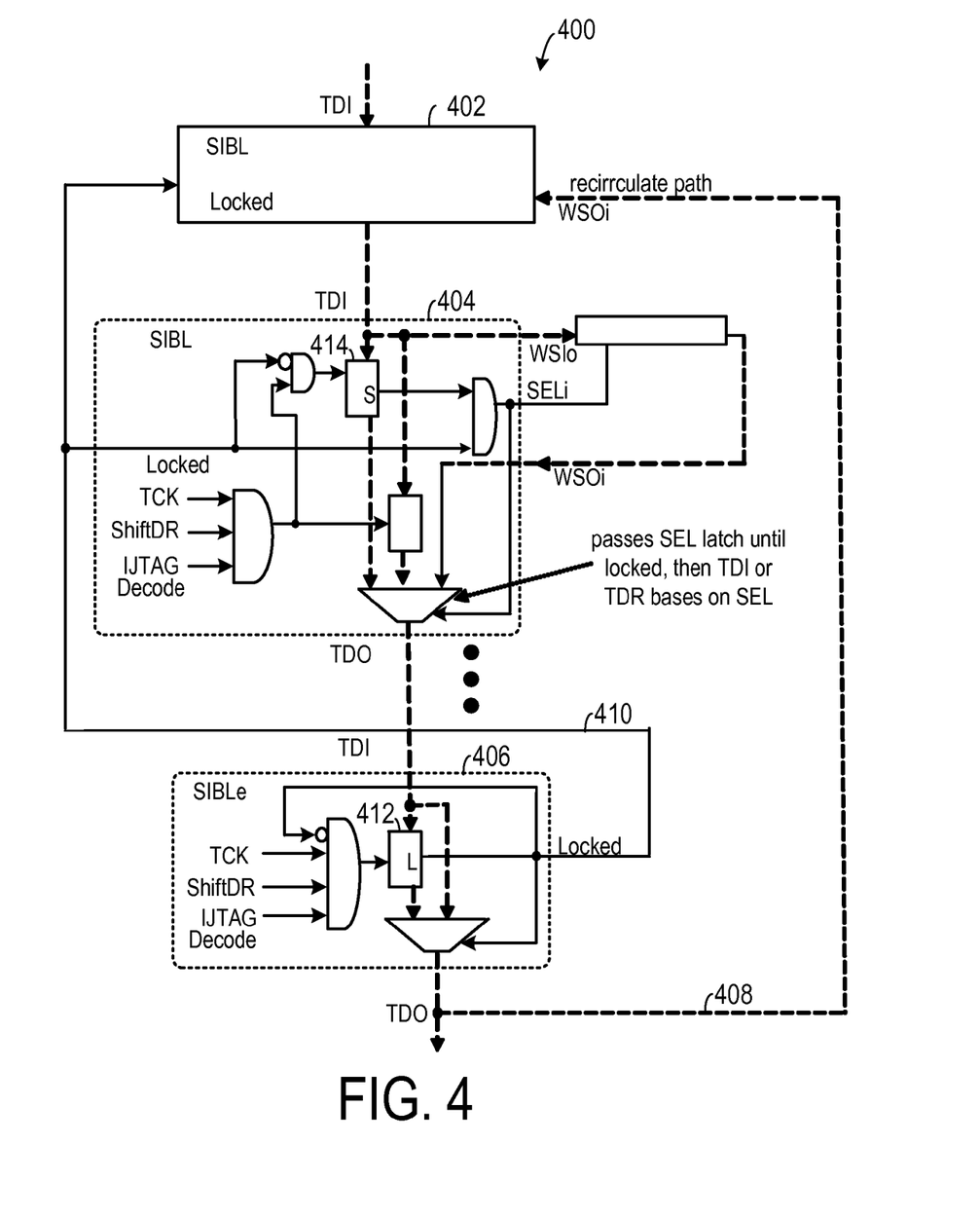
FIG. 4 is a schematic diagram of a chain of select instrument bit locked cells.

An embodiment of a distributed select instrument bit locked (SIBL) chain 400 of SIBL cells 402 and 404 is shown in FIG. 4. This embodiment combines the daisy-chain concept shown in FIG. 3 with the signal pass-through data shift test access port (TAP) concept shown in FIG. 2. An end select instrument bit locked (SIBLe) 406 is the last cell in the chain and it both provides a recirculation path 408 to the first SIBL 402 and provides the lock control 410 to the other SIBLs 402 and 404. For this distributed SIBL chain 400, the left side of the MUXes on the TDI path is selected until the final LOCK latch 412 is set, then the scan path is determined by the value of the individual SELECT latches 414. Resetting then occurs on UpdateDR when exiting this operation; however an immediate subsequent loop through the data side of the TAP can select a new group with the instruction still being valid.

Figure 5:
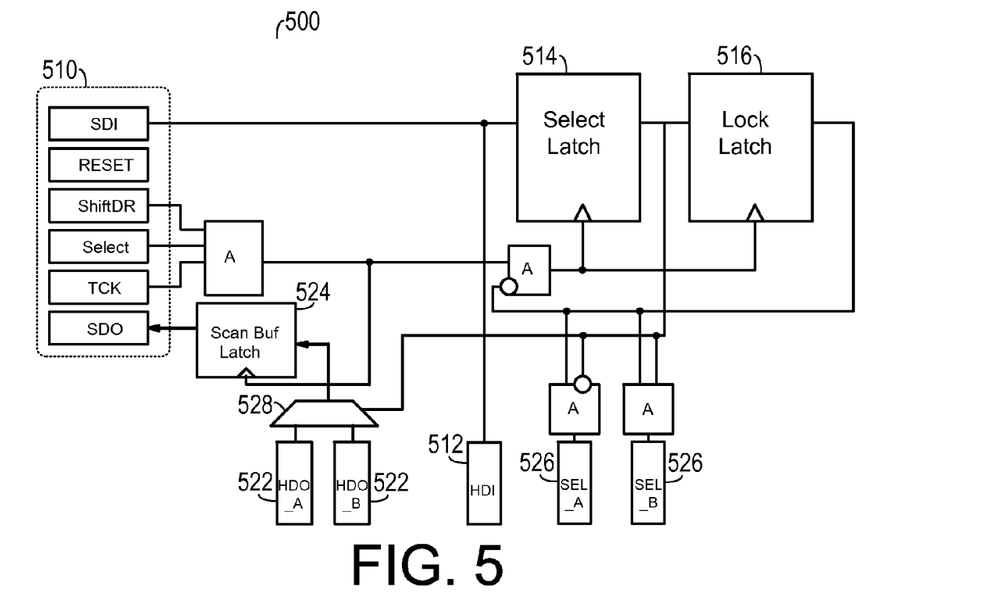
FIG. 5 is a schematic diagram of a Shift Tree Block w/Lock (STBL) cell.

A hierarchal select instrument bit tree may also be employed. As shown in FIG. 5, a Shift Tree Block w/Lock (STBL) 500 is used to allow a hierarchical topology for individual addressing and distribution across the chip. A small bus 510 of signals is used to connect them to other units in the JTAG standard (also referred to as the "1149.1 zone"). In this STBL block 500, scan data in (SDI) data can be written to a select latch 514, a lock latch 516 and selected instrument via a hierarchal data in line 512. In reading data from the instrument, one of a pair of hierarchal data out lines 522 from the corresponding instruments is selected to be written to scan buffer latch 524, based on the value of the scan latch 514, via a multiplexer 528. The value of the scan latch 514 also selects the instrument to be accessed via a selected one of two select instrument lines 526. Data from the scan buffer latch 524 can then be read via a scan data out line (SDO).

Figure 6:
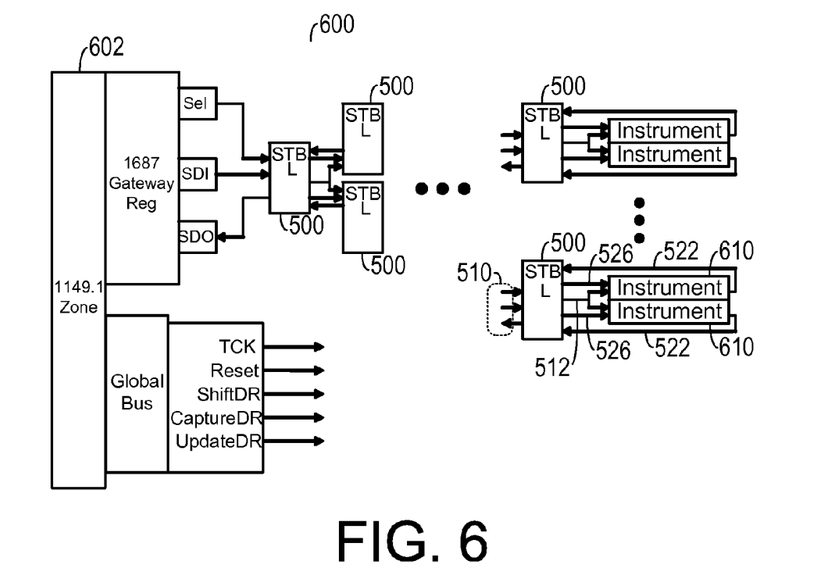
FIG. 6 is a schematic diagram of a Shift Tree Block w/Lock tree structure

As shown in FIG. 6, these STBL blocks 500 can be arranged in a tree structure and interface with the 1149.1 zone, in which intermediate STBL blocks 500 interface in a branching hierarchy and in which the outermost STBL blocks at the bottom of the hierarchy interface with the individual instruments 602. In this setup, the scan path is determined dynamically during the early ShiftDR operation. The shift data header consists of pairs of select and lock bits that will traverse the tree structure to a single end point. This header is immediately followed by scan data for the desired end point instrument or test data register (TDR). In one embodiment the header could be constructed as follows:

(Scan data N DownTo 0) | Hierarchy Select X | '1' | ...

| Hierarchy Select 0 | '1' |
^
This end first

During a scan, the first STBL 500 is selected and shifts in its lock and select bit. When the bits are locked into place, the contents of the select register will select one of the STBLs 500 below it in the hierarchy. The next lock and select bit pair is then shifted into the selected STBL 500. This process is repeated until the bottom of the hierarchy is reached. The last select bits select to the instrument or TDR being targeted. The scan path between TDI and TDO is now the TDR and the scan-buffer in each of the selected STBL's 500. The select latch 514, the lock latch 516, and the scan-buffer latch 524 will reset in the UpdateDR state (this can be synchronously with TCK or asynchronously).

Figure 7:
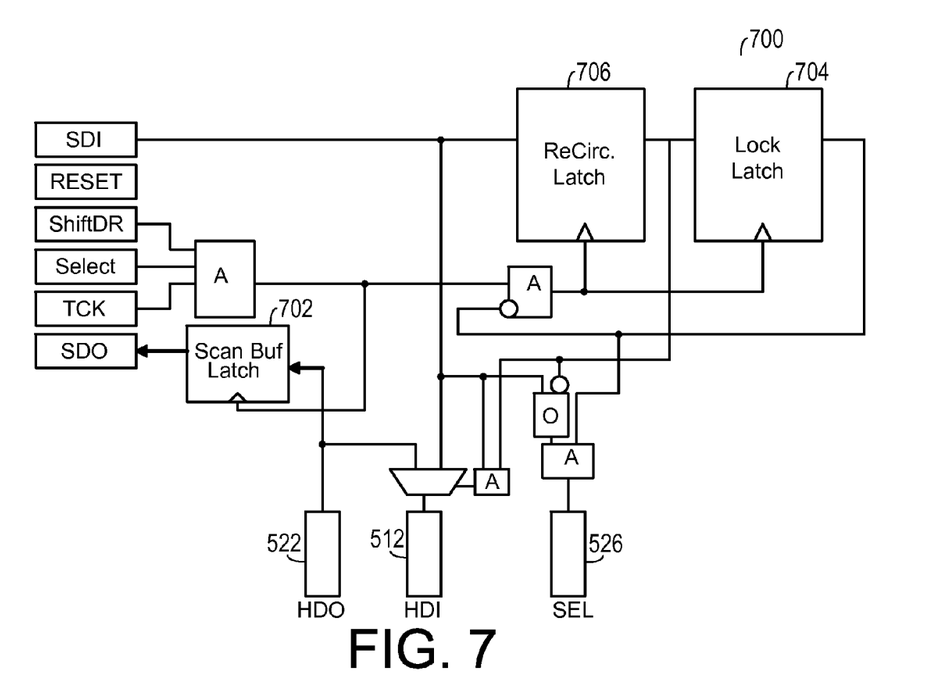
FIG. 7 is a schematic diagram of a Return Tree Block w/Lock (RTBL) cell.

This configuration can operate scan-in's and scan-out's simultaneously, but non-destructive reads (i.e., recirculation) require additional design. Options for this recirculation function include: (1) Software that can recirculate scanned out data back into the TDR. However, such software my require over scanning and may result in additional system requirements; (2) Root hardware that requires a new OR network of locked signals from all the endpoints to trigger the recirculation function; or (3) a Return Tree Block w/Lock (RTBL) 700, as shown in FIG. 7.

The RTBL 700 works with additional triggering from the scan data in (SDI) path to stop the recirculation when the TDR has been read, but that has not yet passed through the additional buffer latching (including the scan buffer latch 702 in the RTBL 700). The RTBL 700 is used as an end-point unit (or a "leaf") to the STBL tree structure 600. Like the STBL 500 the RTBL 700 has a lock latch 704 and scan-buffer latch 702. However, instead of locking in a bit to select between instruments, the RTBL 700 selects whether the scan operation will do a scan operation or a scan out-only operation.

When the RTBL 700 locks, the TDR is selected and will start scanning The data coming out of SDO will first be from the scan-buffer latch 702 in the STBL chain. If the recirculation latch bit 706 is low, then data from the scan data in (SDI) will be scanned into the TDR at the same time. If the recirculation bit is high then the data from HDO will be scanned back into the HDI while the SDI is high. When the SDI is lowered the select will de-assert and the TDR will stop scanning. This allows software controls to circulate the data once, and then finish scanning the data out of the scan-buffer latches 702 without disrupting the original data in the TDR. One embodiment of a header format that may be used could be constructed as follows:

(buffer Scan data: X) | (TDR data: N (all 1's) | Recirc. X | Lock X ...

Sel 1 | Lock 1 | Sel 0 | Lock 0
^
This end first

Additional interface select bits could be added to the RTBL 700 or STBL 500 to support interfaces to additional instruments. The number added would depend on the number of instruments that are physically grouped at the endpoint of the hierarchy.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A test data access system operable on an electronic circuit that includes a plurality of instruments, comprising:
   a. a test access port including a test data in (TDI) pin, a test data out (TDO) pin, a decode pin, a reset pin and a clock pin;
   b. a shift register coupled the TDI pin;
   c. a first multiplexer, in data communication with the TDI pin, configured to receive data from the TDI pin and configured to transmit data to each of the instruments, the first multiplexer also configured to receive data from a data recirculation bit, the first multiplexer further configured to transmit data from the TDI pin to a plurality of instruments when the recirculation bit has a first value and to transmit data to the plurality of instruments from a recirculation line when the recirculation bit has a second value, different from the first value;
   d. a second multiplexer, configured to receive data from each of the plurality of instruments and configured to transmit data from a selected one of the plurality of instruments, selected based on a value of data in the shift register;
   e. a first AND gate configured to generate a gates clock to the shift register;
   f. a second AND gate, responsive to the first AND gate, configured to lock the shift register; and g. a third AND gate, responsive to the first AND gate, configured to control clocking to the plurality of instruments.

2. The test data access system of claim 1, wherein a recirculation bit is resident on the shift register.

3. The test data access system of claim 1, wherein the first AND gate is configured to generate a clock signal to the shift register and the plurality of instruments on select JTAG states.

4. The test data access system of claim 1, wherein a lock bit is resident on the shift register.

5. The test data access system of claim 1, wherein the second AND gate is configured to lock the shift register when the lock bit is set.

6. The test data access system of claim 1, wherein the system is configured to operate with an IJTAG platform.

7. The test data access system of claim 1, further comprising a clock configured to clock data shifting into the shift register.

8. The test data access system of claim 1, wherein the system is configured to shift a first portion of a data stream from the TDI into the shift register and then, after the lock bit is set, write data from the TDI through the first multiplexer when the value of the recirculation bit has the first value.

9. The test data access system of claim 1, wherein the system is configured to shift a first portion of a data stream from the TDI into the shift register, then after the lock bit is set, write the data from the second multiplexer through the first multiplexer when the value of the recirculation bit has the second value.

10. The test data access system of claim 1, wherein the first multiplexer is configured to write data to a second plurality of instruments, the system further comprising a second multiplexer, configured to receive data from each of the second plurality of instruments and configured to transmit data from a selected one of the second plurality of instruments, selected based on a value of data in the shift register.

11. The test data access system of claim 1, wherein the third AND gate is configured to enable clocking to only a selected instrument of the plurality of instruments.

12. The test data access system of claim 1, wherein the second multiplexer is configured to write data to a TDO pin.

13. A hierarchical test data topology in an electronic circuit, comprising:
   a. a plurality of lockable shift tree blocks, each including a scan data in line and a scan data out line, each of the plurality of shift tree blocks in data communication with a successive shift tree block so as to be arranged in a tree structure;
   b. a plurality of instruments, each in data communication with a different one of the plurality of lockable shift tree blocks;
   c. a selecting mechanism that reads a shift data header, the shift data header including a plurality of pairs of select and lock bits, each pair targeted for a selected one of the plurality of lockable shift tree blocks, and that writes a different one of the pairs of select and lock bits to each of the plurality of lockable shift tree blocks;
   wherein each of the lockable shift tree blocks is configured be part of a dynamic scan path when its corresponding select and lock bit pair are set at a first state and wherein each of the lockable shift tree blocks is configured not be part of the dynamic scan path when its corresponding select and lock bit pair are set at a second state that is different from the first state.

14. The hierarchical test data topology of claim 13, wherein each of the lockable shift tree blocks comprises
   a. a select latch in data communication with a scan data in line;
   b. a lock latch in data communication with the select latch; and
   c. a multiplexer that selectively couples one of two different data lines to a scan data out line based on a data value stored in the select latch and a data value stored in the lock latch.

15. A method of accessing a test data system, comprising the steps of:
   a. writing a first portion of a test data stream to a shift register;
   b. writing a second portion of the test data stream to a selected instrument when a value of a recirculation bit is set to a first state;
   c. writing data from a recirculation line into the selected instrument when the value of the test data stream is at a first data stream state and a recirculation bit in the shift register is set to a second state, different from the first state; and
   d. stopping writing data from a recirculation line into the selected instrument when the value of the test data stream is at a second data stream state, different from the first data stream state and when the value of the recirculation bit in the shift register is set to a second state, different from the first state.

16. The method of claim 15, wherein the step of writing a first portion of a test data stream and the step of writing a second portion of the test data stream each comprise writing data from a test data in pin.

17. The method of claim 15, further comprising the steps of:
   a. receiving data from a plurality of instruments to a test data output; and
   b. writing data from a selected one of the plurality of instruments to a test data pin when the shift register has a predetermined value stored therein.

18. The method of claim 15, wherein the recirculation bit is resident on a select bit.

19. The method of claim 15, operating on an IJTAG platform.

* * * * *